United States Patent [19]

Montagu

[11] 4,370,613
[45] Jan. 25, 1983

[54] GALVANOMETER WITH MOLDED OUTER LAYER UNDER HOOP STRESS

[75] Inventor: Jean I. Montagu, Brookline, Mass.

[73] Assignee: General Scanning, Inc., Watertown, Mass.

[21] Appl. No.: 317,597

[22] Filed: Nov. 3, 1981

Related U.S. Application Data

[63] Continuation-in-part of Ser. No. 96,612, Nov. 23, 1979, abandoned, and Ser. No. 81,171, Oct. 2, 1979, abandoned.

[51] Int. Cl.³ .......................... G01R 1/04; G01R 5/14; H02K 15/14; H05K 5/00
[52] U.S. Cl. ................................. 324/154 R; 29/606; 174/52 PE; 324/156; 335/230
[58] Field of Search ................ 324/146, 147, 151–155, 324/156, 157; 29/447, 596, 606–609; 53/557; 174/52 PE; 310/43, 45, 71; 335/222, 223, 229, 230, 281; 336/96

[56] References Cited

U.S. PATENT DOCUMENTS

| | | | |
|---|---|---|---|
| 2,821,155 | 1/1958 | Seckel | 29/447 |
| 2,887,657 | 5/1959 | Lamb et al. | 324/151 A |
| 2,911,709 | 11/1959 | Boynton | 29/447 X |
| 2,972,717 | 2/1961 | Triplett | 324/151 R |
| 3,141,133 | 7/1964 | Wahlstedt | 324/151 A |
| 3,354,541 | 11/1967 | Gosma | 29/607 |
| 3,593,135 | 7/1971 | Schwartz | 29/607 |
| 3,624,574 | 11/1971 | Montagu | 335/230 |
| 3,684,959 | 8/1972 | Spira et al. | 324/151 R |
| 3,867,658 | 2/1975 | Dochterman | 310/71 |
| 3,891,922 | 6/1975 | Atzinger | 324/151 R |
| 3,896,604 | 7/1975 | Marantz | 53/557 X |
| 4,015,154 | 3/1977 | Tanaka et al. | 310/43 |
| 4,075,561 | 2/1978 | Stevens | 324/156 X |
| 4,105,969 | 8/1978 | Ivy | 324/156 X |
| 4,110,651 | 8/1978 | Fagan | 310/71 X |
| 4,191,240 | 3/1980 | Rule et al. | 310/43 X |
| 4,211,992 | 7/1980 | Gaskill | 324/151 AX |

FOREIGN PATENT DOCUMENTS 2723979 4/1978 Fed. Rep. of Germany ........ 310/43

OTHER PUBLICATIONS

Milby, Robert V., *Plastic Technology*, McGraw-Hill (1973), Chapter 5, "Epoxy Plastics," pp. 76–77.
"LNP Glass-Fortified Nylon Thermocomp ® Series," *LNP Fortified Polymers* ®, Bulletin 203-576 (May, 1976).

*Primary Examiner*—Gerard R. Strecker

[57] ABSTRACT

The invention relates to a limited rotation galvanometer having a shaft adapted to be deflected in accordance with an electrical drive signal applied to the galvanometer, the galvanometer comprising a stator assembly formed of at least one stationary permanent magnet and at least one pole piece cooperatively arranged about a hollow bore, a rotor associated with the shaft and mounted to turn in the hollow bore, and an electrical winding wound about the pole piece and adapted to receive the drive signal, this stator assembly and rotor defining magnetic circuitry for operation of the galvanometer, the deflection of the rotor being dependent upon the rigidity of the stator assembly and the value of the torque applied between the stator assembly the rotor by the application of the drive signal to the winding. According to the invention the galvanometer includes a molded, hoop-like outermost layer of rigid, reinforced stress-resistant synthetic resin material extending continuously around the exterior of the galvanometer, the synthetic resin material having the property of shrinking at least 1% during solidification, or preferably, the synthetic resin material being nylon, the layer engaging the outer surfaces of the winding, the magnet, and the pole piece, the molded hoop-like layer residing under substantial pre-stress hoop tension as the result of shrinkage during solidification of the synthetic resin material during molding, the molded hoop-like external layer applying stress to the stator assembly, thereby to force the magnet and the pole piece against one another, thereby imparting rigidity to the stator assembly and contributing to the accuracy of the deflection of the galvanometer.

20 Claims, 20 Drawing Figures

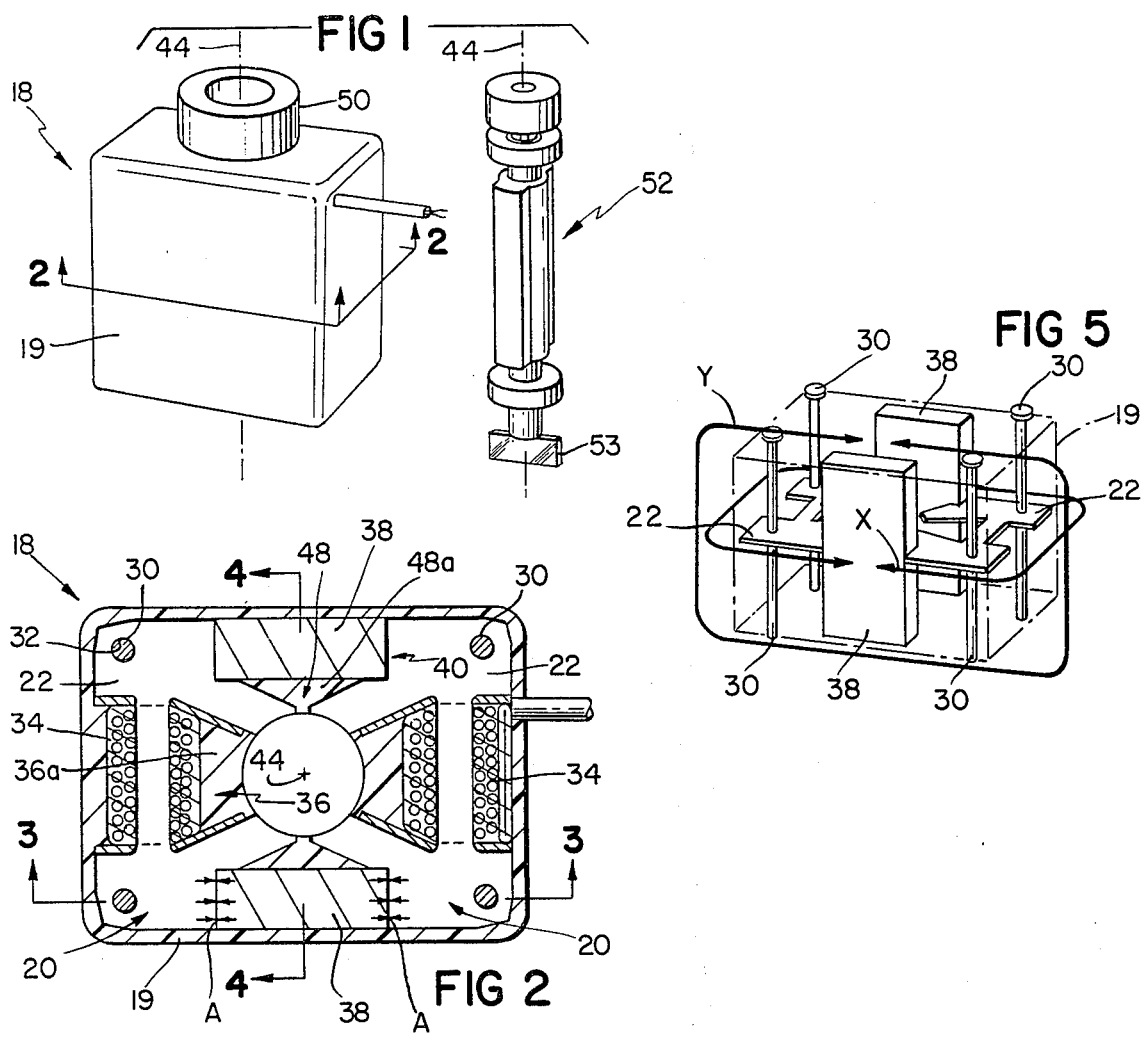
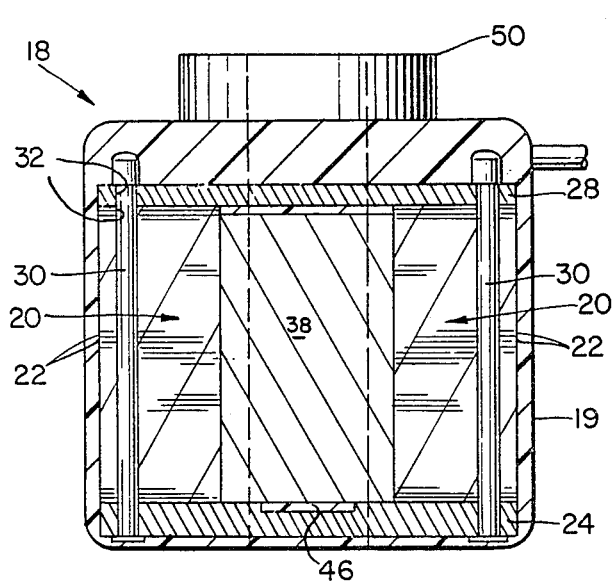
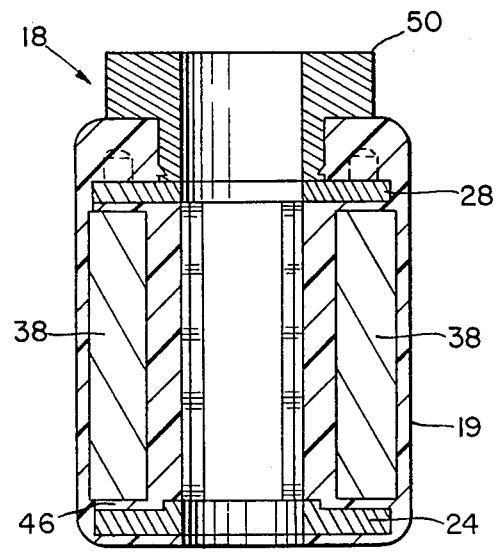

FIG 14
FIG 13
FIG 11
FIG 12
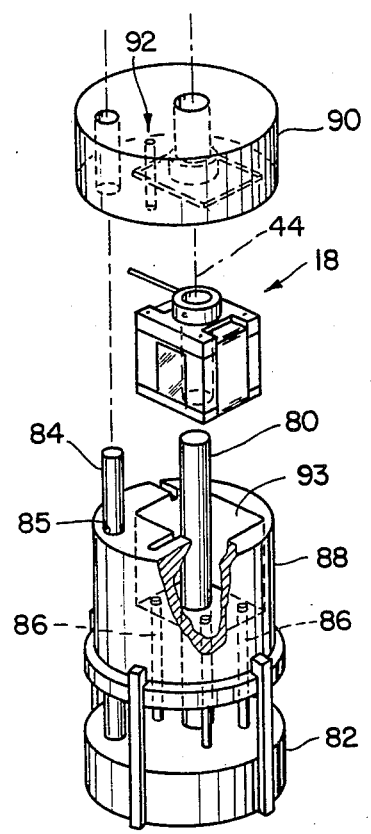
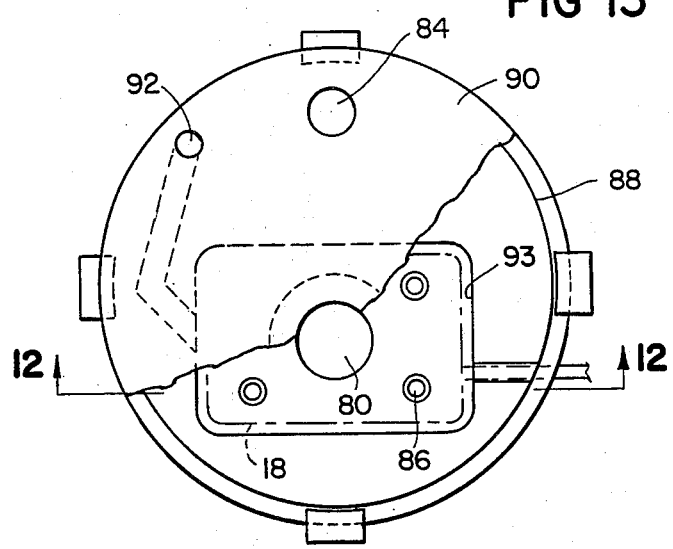
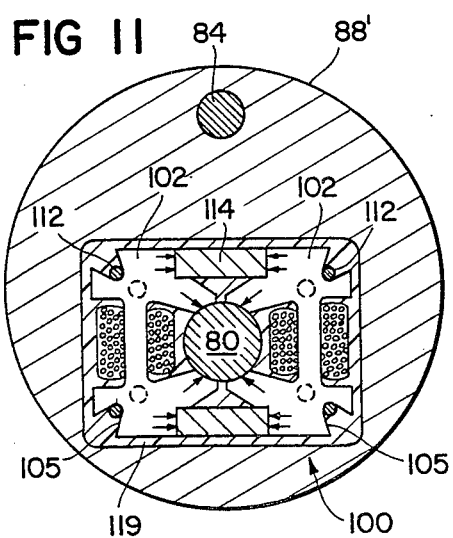
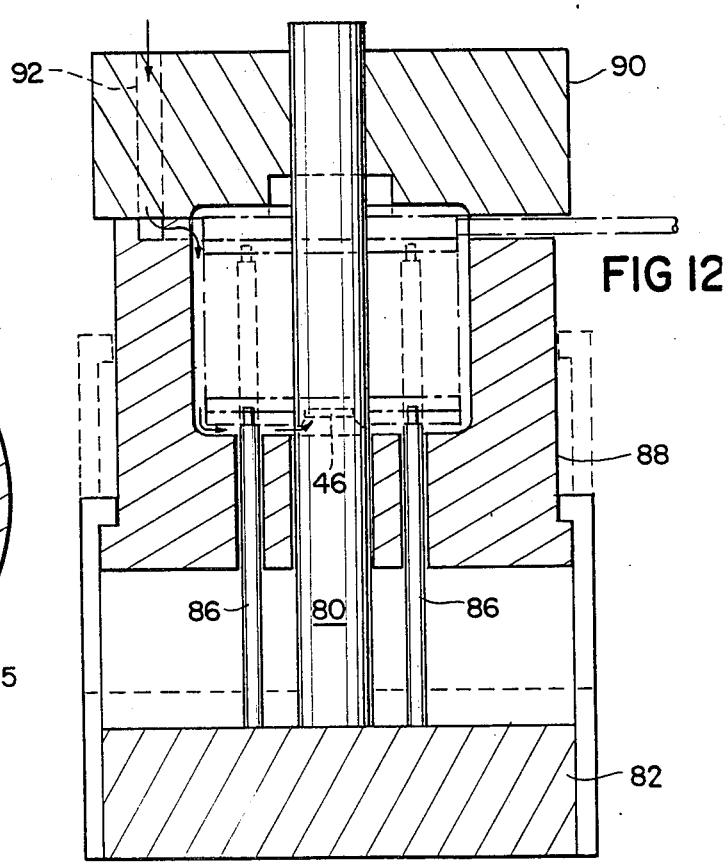

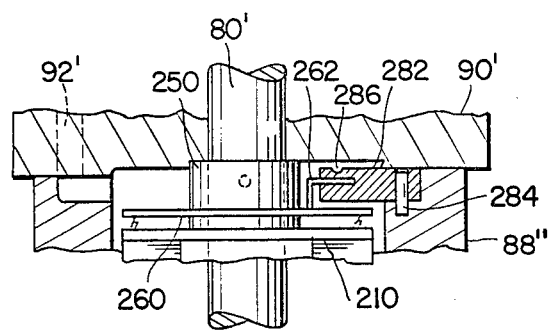

GALVANOMETER WITH MOLDED OUTER LAYER UNDER HOOP STRESS

BACKGROUND OF THE INVENTION

This application is a continuation-in-part of my copending U.S. application Ser. No. 81,171, filed Oct. 2, 1979, and U.S. application Ser. No. 96,612 filed Nov. 23, 1979, both now abandoned, all three applications being assigned to General Scanning, Inc.

This invention relates to galvanometers and their stator assemblies. Such assemblies must be rigidly constructed to assure accuracy during operation and to withstand honing of the interior cylindrical pole faces of the stator assembly which define the space for the galvanometer rotor.

To provide rigidity, the laminated stator pieces with coils in place are ordinarily aligned with each other and with magnets interposed by suitable jigs, they are clamped between top and bottom plates with rivets or screws, the jigs are removed, and the assembly is potted into an aluminum can. Honing of the stator pole faces is thereafter performed to achieve proper alignment of the faces with the rotor that is subsequently inserted.

One drawback of such current constructions is that, when the jigs are removed, there is a release of stresses and a certain amount of spring-back of the lamination pieces causing misalignment of individual laminations and an increased need for honing. A substantial percentage of assemblies may be rejected because the misalignment is too severe to be corrected by honing. Another drawback of such construction is that epoxy potting is labor intensive, requiring partial filling and evacuation of bubbles before complete filling. Finally, epoxy potting is somewhat elastic, permitting movement of the stator relative to its mounting. This can result in detrimental hysteresis. Welding of the laminations to overcome some of these difficulties adds considerably to production cost.

SUMMARY OF THE INVENTION

The invention can be summarized as relating to a limited rotation galvanometer having a shaft adapted to be deflected in accordance with an electrical drive signal applied to the galvanometer, the galvanometer comprising a stator assembly formed of at least one stationary permanent magnet and at least one pole piece cooperatively arranged about a hollow bore, a rotor associated with the shaft and mounted to turn in the hollow bore, and an electrical winding wound about the pole piece and adapted to receive the drive signal, this stator assembly and rotor defining magnetic circuitry for operation of the galvanometer, the deflection of the rotor being dependent upon the rigidity of the stator assembly and the value of the torque applied between the stator assembly and the rotor by the application of the drive signal to the winding.

According to the invention the galvanometer includes a molded, hoop-like outermost layer of rigid, reinforced stress-resistant synthetic resin material extending continuously around the exterior of the galvanometer, the synthetic resin material having the property of shrinking at least 1% during solidification (preferably, the synthetic resin material being nylon) the layer engaging the outer surfaces of the winding, the magnet, and the pole piece, the molded hoop-like layer residing under substantial pre-stress hoop tension as the result of shrinkage during solidification of the synthetic resin material during molding, the molded hoop-like external layer applying stress to the stator assembly, thereby to force the magnet and the pole piece against one another, thereby imparting rigidity to the stator assembly and contributing to the accuracy of the deflection of the galvanometer.

The rigid molded layer according to the invention can avoid the need for epoxy potting or aluminum cans, can reduce the need for honing and can limit the stator to less movement than is the case with conventional assemblies. The rigid resin layer can so force the stator parts and the magnet against each other that constant magnetic properties are maintained in the magnetic circuit established between the stator and magnet. The rigid molded layer can also enable use of sintered stator pieces which eliminate additional problems and costs associated with stators formed of laminations.

In particular, injection molding a rigid thermoplastic outer layer that shrinks around the galvanometer stator as it cools and solidifies enables a less costly and more efficient galvanometer to be produced.

In preferred embodiments according to the invention: there are stator parts on opposite sides of the rotor axis and there are a pair of magnets, one disposed between opposed stator parts on each side of the rotor axis; the stator parts are gripped prior to molding by mechanical holding means incapable alone of properly holding the pieces in position during operation of the galvanometer, the mechanical holding means being embedded in the rigid layer that fixes the parts of the stator against movement; the stator comprises at least two pieces of molded sintered metal positioned around the rotor, and the molded sintered pieces include grippable formations molded on the exterior of the pieces that are gripped by the holding means; the molded sintered pieces are imperforate, the grippable formations comprise exterior channels, and the mechanical holding means comprises holding pins residing in and engaging the sides of the channels; the stator comprises a plurality of substantially identical planar metal laminations stacked vertically, the rigid layer is molded about these laminations and the layer serves to maintain the laminations in a fixed position relative to each other and relative to the rotor; the rigid layer is preferably thermoplastic nylon reinforced with a material such as glass fibers; the rigid outer resin layer is molded about the stator in the direction around the axis of the stator and in the direction around its end plates, in both cases the layer residing under hoop tension as a result of solidification and shrinkage of the material following molding, and serving to rigidly fix the parts of the stator.

Furthermore, in accordance with the invention, portions of rigid synthetic material that are integral with the galvanometer-surrounding rigid layer, are used to encase and position each of a set of electrical connector members for mating with external connectors. By this means, problems during molding, of leaking of plastic along the previously used flexible electrical leads can be avoided, and a construction that is readily installed with external circuits is inexpensively achieved. Preferably the encased electrical connectors are rigid pins insulated from each other by the molded material; the electrical connector members are joined to a printed circuit board that is embedded in the molded material, preferably the board having a central aperture and surrounding the rotor; the electrical connector members are grouped to receive an external plug; and a detent molded of the rigid material retains the plug, preferably this detent being a molded cantilever spring.

PREFERRED EMBODIMENTS

We turn now to the structure and manufacture of preferred embodiments of the invention, after briefly describing the drawings.

FIG. 1 is a perspective view of a stator of a first preferred embodiment having flexible electrical leads that protrude through the molded layer;

FIG. 2 is a horizontal cross-section of the stator taken along 2—2 of FIG. 1;

FIG. 3 is a vertical cross-section of the stator taken along 3—3 of FIG. 2;

FIG. 4 is a vertical cross-section taken along 4—4 of FIG. 2;

FIG. 5 is a diagrammatic perspective view of stator laminations and magnets exposed to hoop stresses;

Figure 6:
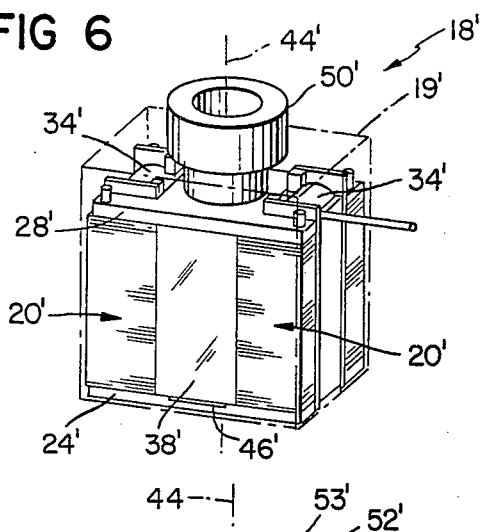
FIG. 6 is a perspective view of an alternative embodiment with the side of the layer partially cut away.
Figure 7:
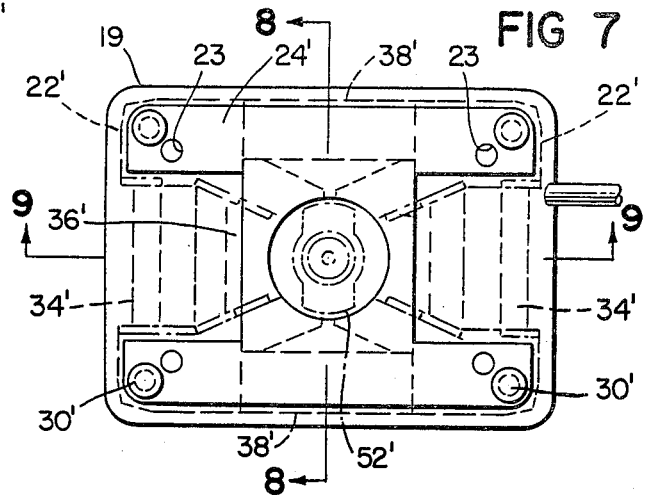
FIG. 7 is a bottom view of the embodiment of FIG. 6.
Figure 8:
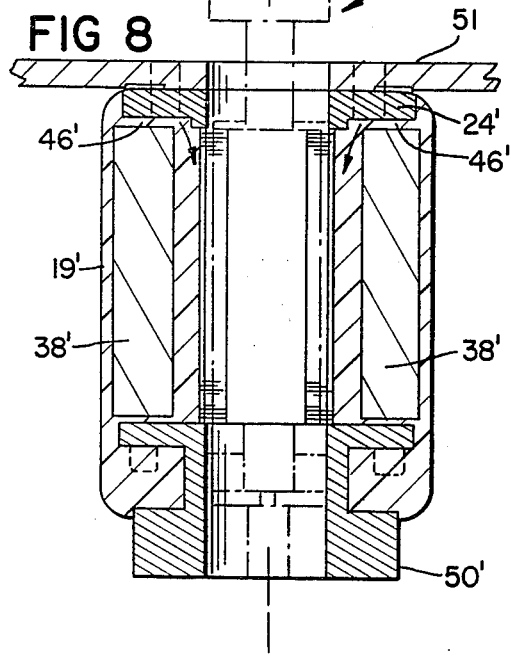
Figure 9:
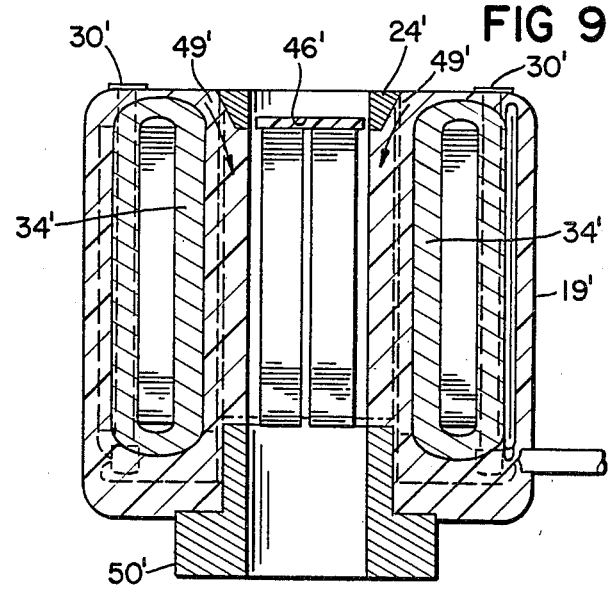
Figure 10:
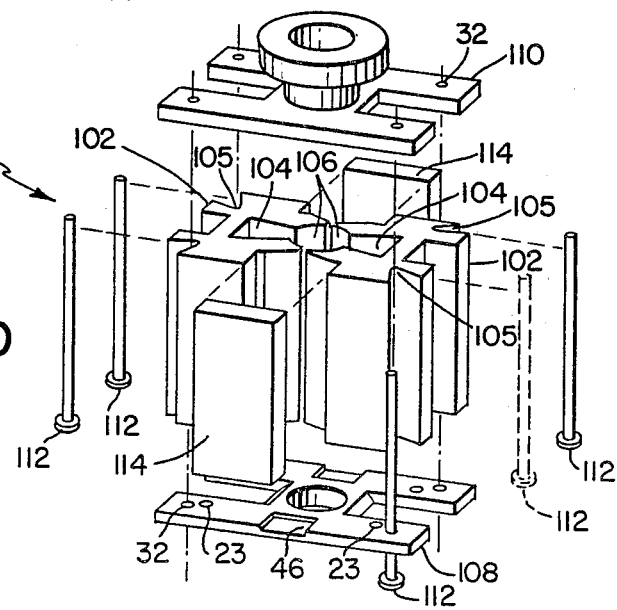

FIGS. 8 and 9 are vertical cross-section views along 8—8 and 9—9 of FIG. 7;

FIG. 10 is a perspective exploded view of a preferred stator molded of sintered metal pieces;

FIG. 11 is a cross-section of the stator of FIG. 10 showing a mold;

FIG. 12 is a side cross-section of the stator in the mold;

FIG. 13 is a top view of the mold and stator;

FIG. 14 is a perspective view of the mold and stator;

FIG. 15 is a perspective view of a preferred embodiment having a printed circuit board and electrical connector pins encased by the molded material;

FIG. 16 is a vertical cross-section of a portion of the embodiment of FIG. 15 during molding;

FIG. 17 is a diagrammatic view of the printed circuit board during molding;

FIG. 18 is a vertical cross-section taken along 18—18 of FIG. 15;

FIG. 19 is a vertical section taken along 19—19 of FIG. 15;

FIG. 20 is a perspective exploded view of parts of the embodiment of FIG. 15.

STRUCTURE

Referring to FIGS. 1–5, stator 18 for a limited rotation galvanometer is of laminated construction with the rigid outer thermoplastic layer 19 molded around axis 44 and around the end plates 24, 28 of the stator (see FIGS. 2 and 3 respectively). Pole piece assemblies 20 are formed from a large number of identical thin laminations 22 stacked vertically with die cast aluminum plates 24 and 28 respectively on the bottom and top. The assembly is riveted by aluminum rivets 30 through holes in the laminations and end plates. Wire windings 34 are wound around the assemblies through recesses 36 at opposite sides at the long ends of the assemblies while two permanent magnets 38 are disposed between the assemblies in recesses 40 at the other sides. A generally cylindrical recess is formed in the center of stator 18 by the various parts described.

Outer layer 19 is injection molded nylon, (characteristic mold shrinkage of nylon is in excess of 1%).

Plate 24 has a groove 46 having a resin flow space between the plate and magnet 38.

The injection molded material extends through groove 46 between magnets 38 and plate 24 and through other openings not shown to fill the interior spaces within the stator and to pot the windings and magnet as indicated by numerals 36a and 48a in FIG. 2. Annular collar 50, which serves in the final assembly to seat a torsion bar attached to rotor 52, is molded into and secured by material, see FIG. 4. (The function of the torsion bar is explained in my U.S. Pat. No. 3,624,574.)

The molded, rigid outer layer 19 exists under hoop tension in the directions indicated by lines x and y and arrows in FIG. 5 as a result of solidifying and shrinking upon cooling from molding. The hoop tension is communicated to laminations 22 serving to force them together with magnets 38 (see compression arrows A, FIG. 2) and each other, and fixes them against movement under a prestressed condition that produces superior hysteresis-free performance.

FIGS. 6–9 depict another embodiment in which layer 19' is molded only in the direction around axis 44' and collar 50' is integral with plate 28'. The exposed end plate 24' of the molded assembly is clamped against a metal mounting plate 51. This construction enables unimpeded heat flow from the interior of the galvanometer to the mounting plate and this plate serves as a heat sink and dissipator. The limited rotation rotor 52' is shown assembled with the stator in these figures and drives a mirror 53 as an optical scanner. Other parts corresponding to these in the first embodiment are denoted by corresponding primed numerals.

An alternate embodiment using sintered metal pole pieces in place of laminations is depicted in FIGS. 9 and 10. Stator 100 is molded in the form of two one inch high pole pieces 102 of 50 percent nickel and 50 percent iron. Each piece includes recesses 104 for wire windings and pole faces 106 to define a cylindrical rotor space. Magnets 114 are disposed between pieces 102. On the exterior of pieces 102 are molded vertical channels 105. The pieces are located between plates 108 and 110 by aluminum pins 112 which are fixed to the plates and lie within and engage opposite surfaces of channels 105. Outer layer of rigid thermoplastic 119 is molded about the rotor axis as described above with respect to the laminated stators.

The embodiment with the improved electrical connector features of the invention is depicted in FIGS. 15–20. Galvanometer 218 is encased in rigid outer thermoplastic layer 219 and is generally constructed as in the prior embodiments with pole piece assemblies 220, drive windings 234, pick-off windings 234', magnets 238, and rotor 252. The windings are connected to circuits on printed circuit board 260 and male connector pins 262 in electrical continuity with these circuits. Board 260 is completely encased in layer 219 and has central locating aperture 261, the board surrounding rotor 252. Pins 262 are soldered to board 260 and are bent at right angles to extend through layer 219, to be exposed in recess 264. Detent member 266 in the form of a molded cantilever spring extends integrally from its root at layer 219 to define one wall of recess 264.

External plug 270, for connecting the galvanometer to external circuitry, is constructed to fit into recess 264 and has recessed female connectors 224 to engage pins 262. In sliding plug 270 into the recess, member 266 is cammed slightly upwardly so as to be biased against plug 270 until ridge 268 in the detent member engages corresponding groove 272 in plug 270 to lock the plug into place.

Metal collar 250, FIGS. 15 and 18, is generally annular with integral tang 251 extending through layer 219 to the exterior wall 217. Collar 250 and tang 251 are integral with plate 210. Hole 274 extends through tang 251 and collar 250. This hole receives set screw 276 which fixes torsion bar bushing 278 to one end of torsion bar 280. As depicted in FIG. 5 of my U.S. Pat. No. 3,264,574, the torsion bar (20' in that figure) is fixed to one end of the rotor (12' in the figure). Layer 219 is molded to be essentially flush with the end surface of collar 250.

Shrink Property of the Resin/Hoop Stress

For use according to the invention the synthetic resin is chosen to have its mold shrinkage property unreinforced in its unreinforced form in excess of 1%. Nylon is presently the most preferred resin, because of its known properties, especially in regard to yield strength, creep modulus and flexural tensile strength modulus. For example, Nylon 6 available from LNP (Liquid Nitrogen Products) has mold shrinkage of 1.6% (measured with a ¼ inch average section thickness) while Nylon 6/6 has mold shrinkage of 1.8%. The above published shrinkage properties, related to the synthetic resin per se, indicate the ability of the resin material to induce the needed level of pre-stress in the outer resin layer of the galvanometer in the molding process.

Reinforcement of the resin (glass fiber reinforcement, in the range of 10–30%, preferably 20%) improves the creep property of the mix to enable the prestress level to be maintained during usage. (Measured mold shrinkage of such a reinforced mix is typically less than the pure resin material, e.g. because less resin is present per volume.)

According to the invention the material is molded in relatively thin layer (e.g. 1 mm. thick), surrounding the metal structure of the galvanometer, e.g. the magnet and pole piece stator assembly and the windings. The step of molding occurs very quickly. The injected resin, at 500° F. when introduced to the mold, rapidly cools by loss of heat both to the surrounding metal mold and the large internal metal mass of the stator assembly.

Under these conditions, and because of metal occupying most of the interior, little change in actual external dimension of the complete galvanometer actually occurs from the time of the initial mold filling to the solidification of the unit (over a period e.g. of 30 seconds). Instead the desired level of hoop stress (approximately 1000 psi) is induced in the surrounding resin layer, a stress which substantially remains throughout the life of the product.

In summary, the internal metal parts of the galvanometer become an integral element of the molded product in fashion similar to the effects of the fiber reinforcement, so that actual observed shrinkage is very little. Instead, the inherent shrinkage tendency of the resin, and the resistance provided by the metal parts butting each other provide the desired pre-stress condition and the fibers in the resin mix prevent yield and creep over time.

Manufacture

Manufacture of the laminated stator is achieved by aligning laminations 22 with temporary jigs. Magnets 38 are temporarily fixed to the assemblies and the stator parts are clamped in position between the end plates. Four holes 32, drilled through the plates and stamped in the laminations, receive rivets 30. The peening process for the rivets causes the rivets to compress and fill the holes and secure the assembly but not sufficiently to be satisfactory for operation of the galvanometer.

With the stator parts in place against central mandrel 80 (FIGS. 11–14) the mold is closed around the parts. The mold has a bottom piece 82 to which are fixed mandrel 80, locating rod 84, and ejection pins 86. Middle part 88 of the mold has a hole 85 through which rod 84 extends. The stator parts of FIGS. 1–4 are positioned in the mold and held off of the bottom of mold part 88 by pins 86, which also serve to prevent the layer 19 from covering screw mounting holes 23 in plate 24. (The stator end plate 24' of the embodiment of FIGS. 6–9 engages a corresponding mold surface and is thus kept free of the injection molded material).

The molten thermoplastic material is introduced through port 92 in top mold piece 90 and flows immediately into cavity 93 around the exterior of the stator. The material then flows through the space between magnets 38 and grooves 46 so as to reach the interior and form potting 48a. The material also flows through end spaces 49 and around windings 34 to pot the windings on the inside at 36a. Such flow to the interior takes place after the material has filled around the exterior surfaces of the stator. As a result of delayed entry to interior spaces and of greater exterior surface area, the molten thermoplastic layer will produce a net tendency to hold the magnets in place rather than force them outwardly from the recesses in the stator pieces. As the outer layer cools, solidifies and shrinks, hoop stresses thus produced impose a net inward force on the laminations and magnets 38 tightly together and establishes the laminations in a fixed position relative to each other, relative to the magnet and relative to axis 44.

Ejection pins 86 serve to permit gases to escape and to eject the stator from the mold.

The alternate embodiment using molded sintered metal pole pieces with molded channels 105 is manufactured by aligning and fixing the sintered pieces between plates 108 and 110 using pins 112 which engage channels 105. No through holes need be drilled, and there is no need to stamp laminated pieces. While the holding means alone would not be satisfactory for fixing the pieces during galvanometer operation, the outer continuous layer 119 of rigid thermoplastic material when molded as described serves to impart a net inward force on the pieces, forcing them together with the magnets under a pre-stressed condition and establishes them in a fixed position relative to each other, relative to the magnets and relative to the axis in a manner that will sustain operational forces without separation or adverse hysteresis. As with the other embodiments, the stator parts are formed to ensure that they engage the corresponding surfaces of the magnets before reaching the mandrel to ensure high pressure contact between the pole pieces and magnets.

When it is desired to mold the material only around the axis of the stator, as is the embodiment of FIGS. 6–9, mold pieces 82, 88 and 90 are designed to prevent flow over the metal end plate 24. This leaves the plate exposed to transmit heat away to an adjoining surface, to effect cooling of the galvanometer, as mentioned above.

Manufacture of the embodiment of FIG. 15 is shown in FIGS. 18 and 19. Pins 262 are soldered to printed circuit board 260, and the stator assembly is positioned in a mold around mandrel 80'. Metal mold plug form 282, secured in mold wall 88' by two rods 284, receives portions of pins 262 to prevent flowing thermoplastic material from covering them, and to position and support the pins and the circuit board during molding. Molten thermoplastic material enters through port 92' into gaps around board 260 and exposed portions of pins 262, and, upon cooling, supports and insulates them. Cantilevered detent 266 is formed in the gap between mold 90' and plug form 282, ridge 268 being formed by indentation 286. After molding, plug form 282 is removed to expose portions of pins 262. Tang 251 extends to the mold wall and thus will have an exposed surface in the finished product so as to avoid the need for drilling through layer 219 to install set screw 276.

Performance

The resultant molded hoop-like external layer applies stress to the stator assembly, to force the magnet and the pole pieces against one another, thereby imparting rigidity to the stator assembly and contributing to the accuracy of the deflection of the galvanometer. It has been shown that a galvanometer thus manufactured according to the invention, omitting the conventional outer metal housing, can achieve one arc second repeatability of the positioning of the rotor in response to signals applied to the winding.

Furthermore, it has been shown that the invention allows needed rigidity to be achieved in galvanometers within needed small space. This achievement has enabled the use of the moving iron galvanometer, produced according to the invention, to replace relatively more expensive galvanometers of the moving coil type, for instance in EEG (electroencephalograph) instruments. Furthermore, in galvanometers for EKG (electrocardiograph) instruments, the galvanometers manufactured according to the present invention have shown, in the assembly line, unit-to-unit observed repeatability with respect to linearity, hysteresis, and sensitivity that are substantially improved relative to galvanometers heretofore manufactured with the conventional outer metal housing. This repeatability leads not only to substantial cost advantage in the manufacturing process but also improved performance in the field because required adjustments of the supportive electronics for the galvanometer are substantially reduced.

Other Embodiments

Other embodiments are within the following claims. For example, additional molded sintered pieces can be stacked about the rotor to provide greater height, preferably less than 3 inches. The layer can be reinforced with other materials.

What is claimed is:

1. A limited rotation galvanometer having a shaft adapted to be deflected in accordance with an electrical drive signal applied to said galvanometer,
    said galvanometer comprising a stator assembly formed of at least one stationary permanent magnet and at least one pole piece cooperatively arranged about a hollow bore,
    a rotor associated with said shaft and mounted to turn in said hollow bore,
    and an electrical winding wound about said pole piece and adapted to receive said drive signal,
    said stator assembly and rotor defining magnetic circuitry for operation of said galvanometer,
    the deflection of said rotor being dependent upon the rigidity of said stator assembly and the value of the torque applied between said stator assembly and said rotor by the application of said drive signal to said winding,
    said galvanometer including a molded, hoop-like outermost layer of rigid, reinforced stress-resistant synthetic resin material extending continuously around the exterior of said galvanometer,
    said synthetic resin having the property of shrinking at least 1% during solidification,
    said layer engaging the outer surfaces of said winding, said magnet, and said pole piece,
    said molded hoop-like layer residing under substantial pre-stress hoop tension as the result of shrinkage during solidification of said synthetic resin during molding,
    said molded hoop-like external layer applying stress to said stator assembly, thereby to force said magnet and said pole piece against one another, thereby imparting rigidity to said stator assembly and contributing to the accuracy of the deflection of said galvanometer.

2. The galvanometer of claim 1 wherein said outermost rigid layer comprises injection molded thermoplastic.

3. A limited rotation galvanometer having a shaft adapted to be deflected in accordance with an electrical drive signal applied to said galvanometer,
    said galvanometer comprising a stator assembly formed of at least one stationary permanent magnet and at least one pole piece cooperatively arranged about a hollow bore,
    a rotor associated with said shaft and mounted to turn in said hollow bore,
    and an electrical winding wound about said pole piece and adapted to receive said drive signal,
    said stator assembly and rotor defining magnetic circuitry for operation of said galvanometer,
    the deflection of said rotor being dependent upon the rigidity of said stator assembly and the value of the torque applied between said stator assembly and said rotor by the application of said drive signal to said winding,
    said galvanometer including a molded, hoop-like outermost layer of rigid, reinforced stress-resistant synthetic resin material extending continuously around the exterior of said galvanometer,
    said synthetic resin being nylon and said reinforcement comprising reinforcing glass fibers, said layer being at least 0.5 mm thick,
    said layer engaging the outer surfaces of said winding, said magnet, and said pole piece,
    said molded hoop-like layer residing under substantial pre-stress hoop tension as the result of shrinkage during solidification of said synthetic resin during molding,
    said molded hoop-like external layer applying stress to said stator assembly, thereby to force said magnet and said pole piece against one another, thereby imparting rigidity to said stator assembly and contributing to the accuracy of the deflection of said galvanometer.

4. The galvanometer of claim 2 or 3 including two pole pieces positioned on opposite sides of said rotor, two permanent magnets disposed between said pole pieces, said magnets being positioned on opposite sides of the rotor, said molded hoop-like outermost layer extending continuously about the stator in the direction around the galvanometer axis, the hoop stresses of said layer serving to force said pole pieces and said magnets to press against each other and serving to rigidly fix said pole pieces and magnets against movement relative to the axis of said rotor.

5. The galvanometer of claim 1, 2 or 3 wherein said pole piece is gripped by mechanical holding means incapable alone of properly holding said piece in position during operation of the galvanometer, said mechanical holding means being embedded in said rigid layer that fixes said parts of said stator assembly against movement.

6. The galvanometer of claim 5 wherein said pole piece comprises at least two pieces of molded sintered metal positioned around said rotor, said molded sintered pieces include grippable formations molded on the exterior of said pieces, said formations being gripped by said mechanical holding means.

7. The galvanometer of claim 6 wherein said molded sintered pieces are imperforate, said grippable formations comprise exterior channels, and said mechanical holding means comprise holding pins residing in and engaging the sides of said channels.

8. The galvanometer of claim 1, 2 or 3 wherein said pole piece comprises a plurality of substantially identical planar metal laminations stacked vertically, said rigid layer being molded about said laminations, said layer serving to maintain said laminations in a fixed position relative to each other and relative to said rotor.

9. The galvanometer of claim 1, 2 or 3 wherein said molded outer layer of rigid material extends about the stator assembly in the direction around the galvanometer axis and said hoop tension stresses of said layer maintain said stator assembly parts in a fixed position relative to said rotor axis.

10. The galvanometer of claim 1, 2 or 3 wherein said stator assembly includes end plates that are perpendicular to the galvanometer axis, said rigid outer layer being molded about the stator assembly in the direction around said end plates, said hoop tension stresses of said layer serving to rigidly fix the parts of said stator in the endwise direction.

11. The galvanometer of claim 1, 2 or 3 wherein portions of said electrical winding are embedded in integral portions of said rigid molded outermost layer.

12. The galvanometer of claim 1, 2 or 3 wherein said layer extends continuously in the direction around the galvanometer axis, one end of said galvanometer being free of said layer, said end being defined by a metal end-plate in direct heat-receiving contact with other stator assembly parts, said end plate including mounting means for attachment of said end plate face to face with an external metal mounting surface whereby heat generated within said stator is readily dissipated.

13. The galvanometer of claim 1, 2 or 3 wherein integral portions of said rigid material surround and rigidly locate each of said set of electrical connector members in position to receive mating external electrical connector members for connection of said galvanometer to an external circuit.

14. The galvanometer of claim 13 wherein said set of electrical connector members comprises a series of male connector pins, said pins molded in and insulated from each other by portions of said rigid material that are integral with said layer.

15. The galvanometer of claim 13 wherein said electrical connector members are grouped to receive an external plug, there being a molded detent member integral with said rigid material that forms said layer, said detent positioned along the path of entry of said plug and arranged to engage and retain said external plug when the plug is connected.

16. The galvanometer of claim 15 wherein said detent member is in the form of a cantilever spring detent molded integrally with said layer.

17. The galvanometer of claim 13 wherein said electrical connector members are joined to a printed circuit board, said printed circuit board being embedded in the molded rigid material.

18. The galvanometer of claim 17 wherein said connector members comprise rigid pins fixed to said printed circuit board and extending through the molded rigid material to external exposed portions arranged to receive a connecting plug.

19. The galvanometer of claim 17 wherein said printed circuit board has a central aperture and surrounds the rotor space of said galvanometer.

20. The galvanometer of claim 1, 2 or 3 further comprising a metal annular collar embedded in and rigidly fixed by said synthetic resin, said collar having a set screw extending through a passage and securing said torsion spring, and said collar having a metal side projection extending outwardly beyond said layer of synthetic resin to an external surface of said galvanometer, said setscrew passage extending through said projection whereby said passage can be formed without the necessity of drilling through said rigid synthetic resin.

* * * * *

UNITED STATES PATENT OFFICE
CERTIFICATE OF CORRECTION

Patent No. 4,370,613          Dated   January 25, 1983

Inventor(s) Jean I. Montagu

It is certified that error appears in the above-identified patent and that said Letters Patent are hereby corrected as shown below:

Col. 5, lines 15 and 16, delete "unreinforced" first occurrence in the sentence only.

Signed and Sealed this

Seventeenth Day of May 1983

[SEAL]

Attest:

DONALD J. QUIGG

Attesting Officer    Acting Commissioner of Patents and Trademarks